US008913422B2

(12) United States Patent
Karpov et al.

(10) Patent No.: US 8,913,422 B2
(45) Date of Patent: Dec. 16, 2014

(54) DECREASED SWITCHING CURRENT IN SPIN-TRANSFER TORQUE MEMORY

(71) Applicants: Elijah V. Karpov, Portland, OR (US); Brian S. Doyle, Portland, OR (US); Kaan Oguz, Dublin 2 (IE); Satyarth Suri, Hillsboro, OR (US); Robert S. Chau, Beaverton, OR (US); Charles C. Kuo, Hillsboro, OR (US); Mark L. Doczy, Beaverton, OR (US); David L. Kencke, Beaverton, OR (US)

(72) Inventors: Elijah V. Karpov, Portland, OR (US); Brian S. Doyle, Portland, OR (US); Kaan Oguz, Dublin 2 (IE); Satyarth Suri, Hillsboro, OR (US); Robert S. Chau, Beaverton, OR (US); Charles C. Kuo, Hillsboro, OR (US); Mark L. Doczy, Beaverton, OR (US); David L. Kencke, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 35 days.

(21) Appl. No.: 13/630,896

(22) Filed: Sep. 28, 2012

(65) Prior Publication Data
US 2014/0092677 A1 Apr. 3, 2014

(51) Int. Cl.
| G11C 11/00 | (2006.01) |
| G11C 11/16 | (2006.01) |
| G11C 11/15 | (2006.01) |
| G11C 11/56 | (2006.01) |
| H01L 27/22 | (2006.01) |
| H01F 10/32 | (2006.01) |
| B82Y 25/00 | (2011.01) |

(52) U.S. Cl.
CPC ............... *G11C 11/16* (2013.01); *G11C 11/15* (2013.01); *G11C 11/5607* (2013.01); *H01L 27/222* (2013.01); *H01F 10/3254* (2013.01); *B82Y 25/00* (2013.01)
USPC ....... 365/158; 365/171; 365/173; 365/189.03

(58) Field of Classification Search
CPC .... G11C 11/16; G11C 11/15; G11C 11/5607; H01L 27/222; H01F 10/3254; B82Y 25/00
USPC .............................. 365/158, 171, 173, 189.03
See application file for complete search history.

(56) References Cited

U.S. PATENT DOCUMENTS

| 7,057,920 | B2 * | 6/2006 | Perner et al. ................... | 365/158 |
| 7,092,283 | B2 * | 8/2006 | Jeong et al. .................... | 365/158 |
| 7,230,844 | B2 * | 6/2007 | Deak .............................. | 365/171 |
| 7,345,911 | B2 * | 3/2008 | Min et al. ....................... | 365/158 |
| 7,372,722 | B2 * | 5/2008 | Jeong et al. .................... | 365/158 |
| 7,486,545 | B2 * | 2/2009 | Min et al. ....................... | 365/158 |
| 7,518,897 | B2 * | 4/2009 | Nozieres et al. ................ | 365/50 |
| 7,643,332 | B2 * | 1/2010 | Leuschner ...................... | 365/158 |
| 7,697,322 | B2 * | 4/2010 | Leuschner et al. ............. | 365/158 |

(Continued)

OTHER PUBLICATIONS

Li, Hai et al., "Thermal-Assisted Spin Transfer Torque Memory (STT-RAM) Cell Design Exploration", 2009 IEEE Computer Society Annual Symposium on VLSI, May 13-15, 2009, http://ieeexplore.ieee.org/xpl/mostRecentIssue.jsp?punumber=5076366.

(Continued)

*Primary Examiner* — Viet Q Nguyen
(74) *Attorney, Agent, or Firm* — Blakely, Sokoloff, Taylor & Zafman LLP

(57) ABSTRACT

Switching current in Spin-Transfer Torque Memory (STTM) can be decreased. A magnetic memory cell is driven with a first pulse on a write line of the memory cell to heat the cell. The cell is then driven with a second pulse on the write line to set the state of the cell.

20 Claims, 7 Drawing Sheets

(56) References Cited

U.S. PATENT DOCUMENTS

| | | | |
|---|---|---|---|
| 7,796,428 B2 * | 9/2010 | Redon | 365/171 |
| 7,855,435 B2 * | 12/2010 | Klostermann et al. | 257/584 |
| 7,923,285 B2 * | 4/2011 | Lai et al. | 438/102 |
| 7,944,742 B2 * | 5/2011 | Wang et al. | 365/171 |
| 7,957,181 B2 * | 6/2011 | Nozieres et al. | 365/171 |
| 8,031,519 B2 * | 10/2011 | Javerliac et al. | 365/173 |
| 8,040,718 B2 * | 10/2011 | Ueda | 365/158 |
| 8,064,246 B2 * | 11/2011 | Slonczewski | 365/158 |
| 8,102,701 B2 * | 1/2012 | Prejbeanu et al. | 365/158 |
| 8,111,538 B2 * | 2/2012 | Hosotani et al. | 365/148 |
| 8,154,914 B2 * | 4/2012 | Chen et al. | 365/158 |
| 8,178,387 B2 * | 5/2012 | Cheng et al. | 438/102 |
| 8,199,564 B2 * | 6/2012 | Zheng et al. | 365/158 |
| 8,208,295 B2 * | 6/2012 | Dieny | 365/171 |
| 8,218,349 B2 * | 7/2012 | Berger et al. | 365/148 |
| 8,228,715 B2 * | 7/2012 | Andre et al. | 365/158 |
| 8,379,352 B1 * | 2/2013 | Braganca et al. | 360/324.2 |
| 8,385,107 B2 * | 2/2013 | Prejbeanu | 365/158 |
| 8,400,825 B2 * | 3/2013 | Wang et al. | 365/158 |
| 8,405,173 B2 * | 3/2013 | Kim et al. | 257/421 |
| 8,427,199 B2 * | 4/2013 | Katti | 326/38 |
| 8,456,894 B2 * | 6/2013 | Abraham et al. | 365/158 |
| 8,456,895 B2 * | 6/2013 | Abraham et al. | 365/158 |
| 8,514,615 B2 * | 8/2013 | Slaughter | 365/158 |
| 2006/0102969 A1 | 5/2006 | Huai et al. | |
| 2011/0110151 A1 | 5/2011 | Prejbeanu | |
| 2011/0292714 A1 | 12/2011 | Andre et al. | |
| 2012/0014176 A1 | 1/2012 | Slonczewski | |
| 2012/0243297 A1 * | 9/2012 | Katayama et al. | 365/148 |

OTHER PUBLICATIONS

PCT Search Report, PCT/US2013/045031, Int. Filing Date Jun. 10, 2013, Intel Corporation, Mailing Date Nov. 25, 2013.

* cited by examiner

DECREASED SWITCHING CURRENT IN SPIN-TRANSFER TORQUE MEMORY

FIELD

The present description relates to the field of write operations in perpendicular spin-transfer torque memory and, in particular, to decreasing switching current using heating.

BACKGROUND

Perpendicular Spin-Transfer Torque Memory (STTM) devices operate by driving an electrical current through a pair of ferromagnetic electrodes separated by an oxide-based spacer. The current applies a torque, a spin-transfer torque, on the magnetic moment of electrodes in a memory cell to put a free layer in a parallel or an anti-parallel state with respect to a pinned layer. The direction of the torque depends on the polarity of the current. The amount of torque is related to the amount of current that is driven through the electrodes and the amount of time that the current is applied. For high speed memory which is desired for computer and other data processing applications, a high current is desired in order to reduce the required amount of time. However, higher currents increase power consumption.

STTMs have conflicting design demands. On the one hand, a strong magnet and a large volume make the state of the magnetic memory element more stable but harder to switch. On the other hand, a weak magnet and a small volume make the cell easily switchable by passing a smaller current through the pinned layer but make the device less stable. Accordingly, the strength of the magnet is balanced by its size. A variety of magnet designs materials and compositions have been developed in an effort to find an adequate balance between these two properties.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In embodiments of the present invention the write current of a perpendicular Spin-Transfer Torque Memory (STTM) can be detached from the stability of the cell. For some memory cells, the write current can be reduced by heating the magnetic free layer that forms the storage element of the memory cell. The heating induces magnetization reorientation when the magnetic moment of the pinned layer changes its orientation from perpendicular to in-plane. After the heating, the state of the cell may be switched to a parallel or anti-parallel orientation with less current.

While providing heaters for each cell increases the complexity of a memory array, a memory cell may also be heated by applying a sufficiently high write current. Joule heating, caused by the passage of a write current on a bit line or a word line through a material, causes the free layer in a STTM to become hot and unstable. This instability decreases the critical switching current of the free layer. The state can then be allowed to cool after the programming pulse in order to regain its stability.

Figure 1A:
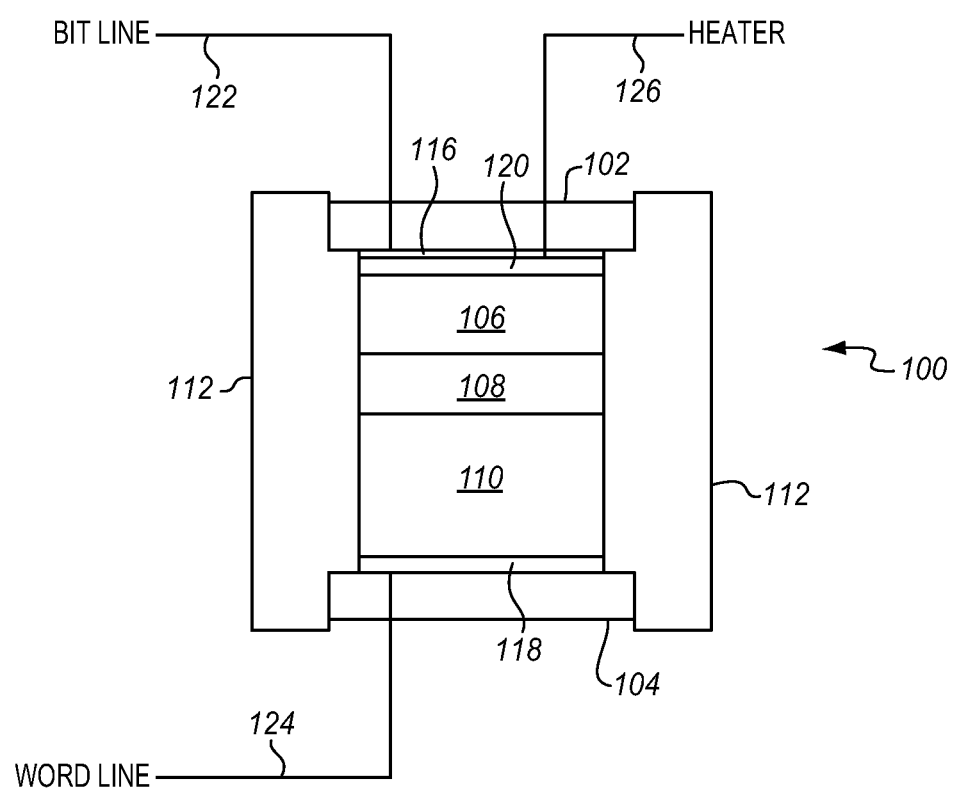
FIG. 1A is a simplified diagram of a spin-transfer torque magnetic memory cell with a heater according to an embodiment of the invention.

FIG. 1A is a simplified diagram of an example STTM 100. The top 102 and bottom 104 materials of this perpendicular STTM consist of interconnect, such as copper, tungsten, Tantalum (nitride), Titanium (nitride), doped silicon, aluminum etc. These provide good conductivity for the interconnects. Between the top and bottom are the active parts of the memory cell: a free layer 106; a barrier layer 108; and a pinned layer 110. An upper electrode 116 is between the free layer 106 and the upper interconnect layer 102. Similarly, a lower electrode 118 is between the pinned layer 110 and the lower interconnect 104. Silicon dioxide or low K dielectrics are established along the sidewalls 112 of the memory cell.

The memory cell's upper electrode is connected to a bitline 122 and the lower electrode is connected to a wordline 124 to write values into the memory. As mentioned above, the memory is written to be applying a current in either one polarization or the other and reversing the polarity of the free layer.

The STTM can also have a heater element 120 formed from amorphous carbon that is placed near the free layer 106. The heater layer is powered by a separate heater line 126. This line may be controlled by the same memory controller that controls the bit line and the word line. To write to the cell, the cell is first heated using the heater line and then written to by a write controller. The heater and the heater line add to the complexity of the memory cell. The third terminal, the heater, and the related driver and control circuits can all be avoided by eliminating the heater.

Figure 1B:
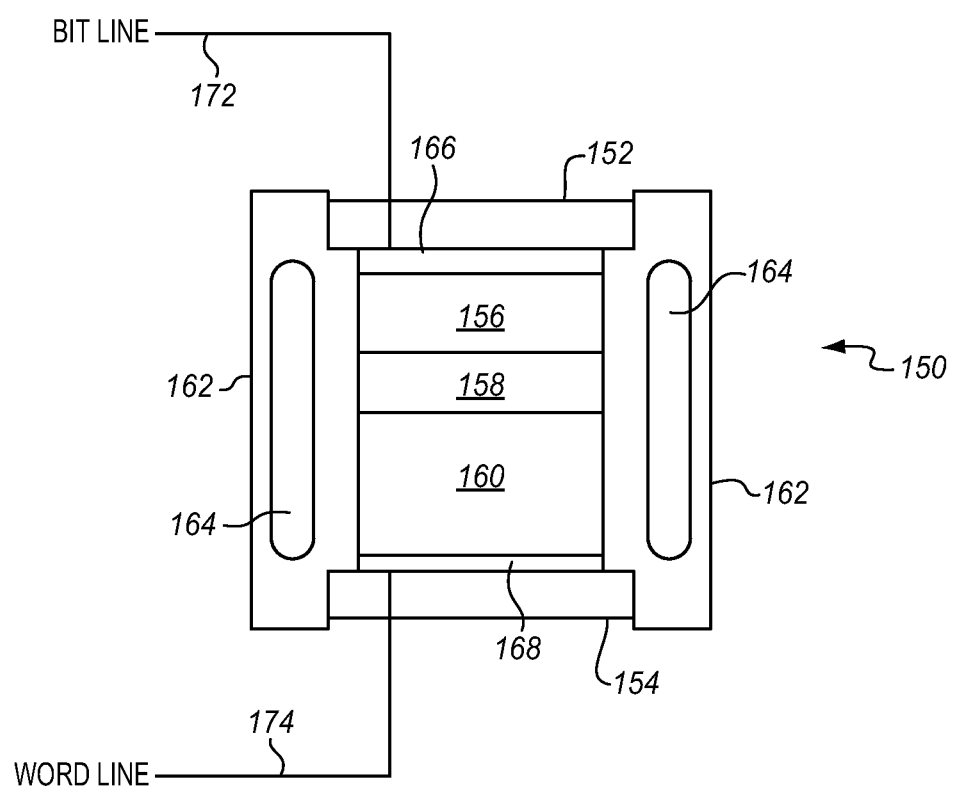
FIG. 1B is a simplified diagram of an insulated spin-transfer torque magnetic memory cell according to an embodiment of the invention.

FIG. 1B is a simplified diagram of another example perpendicular STTM 150. This memory cell does not have a discrete heater. The top 152 and bottom 154 interconnect materials may be copper, tungsten, Tantalum (nitride), Titanium (nitride), doped silicon, aluminum etc. as in the heated example. These conventional materials are inexpensive, good conductors, or good isolators. They are chosen for their electrical properties and not for their thermal properties. However, to better regulate the temperature of the memory cell, thermal materials may be used.

In embodiments of the invention, the thermal materials are chosen as thermal insulators. This allows the cell to be heated with less energy and it allows some isolation from the thermal conditions of other cells. As an example of thermally insulating materials, the top 152 and bottom 154 layers of the perpendicular stack may be formed of thermal resistive layers, such as crystalline conductive chalcogenides, conductive amorphous oxides or conductive magnetic chalcogenides, or thermal interfaces which provide high values of thermal boundary resistance per interface. Thermal conductivities of less than 1 W/km have been found to be useful. To further increase the temperature of the cell, an amorphous carbon layer 120 may be sandwiched between the free layer and the electrode.

The active parts of the memory cell are placed between the top 152 and bottom 154 layers and include a free layer 156, a barrier layer 158 between the free and pinned layers, and the pinned layer 160. An upper electrode 116 is provided to couple a bit line 172 to the memory cell between the free layer 156 and the upper interconnect layer 152. Similarly, a lower electrode 118 is provided to couple to a word line 174 between the pinned layer 156 and the lower interconnect 154. The memory cell similarly includes side walls 162 to isolate the active components of the memory cell.

The diagram of FIGS. 1A and 1B are cross-sections so that the sidewalls appear to be two separate structures, one on either side of the memory cell. The actual memory cell is a three-dimensional form and there is just one sidewall 162 which completely surrounds the outside of the memory cell except at top and bottom where the interconnects and top and bottom layers are located. The memory cell may be constructed so that the layers identified here as top 152 and bottom 154 layers actually are top and bottom layers. The memory cell may be built on a silicon substrate and the bottom layer is closer to the substrate and the below the top layer. However, the invention is not so limited. The memory cell can be built in a variety of different orientations and connections and layers may be added, removed, or modified depending on the particular application.

Commonly, the side walls 162 are formed from silicon dioxide or low K dielectrics. For even more effective thermal isolation, air gaps 164 may be used within the sidewalls. A variety of different types of thermal cladding layers may be used to partially or fully encompass the full STTM stack from interconnect 166 to interconnect 168. A variety of different thermally insulating material may be used in addition to, or instead of those mentioned here.

Without a heater element, the memory cell of FIG. 1B can be connected to a single bitline 172 and a single wordline 174 with one single transistor, as opposed to two in the three-terminal structure of FIG. 1A. The cell size can consequently also be reduced. As described in more detail the separate heater of FIG. 1A is replaced in FIG. 1B by a current applied through the bitline just as a write current is applied. By using the same terminals for heating as are used for writing to the memory cell, the voltage structures and the terminals supplied by those structures for heating the device to a point of instability are the same as those used for switching the device.

Figure 2:
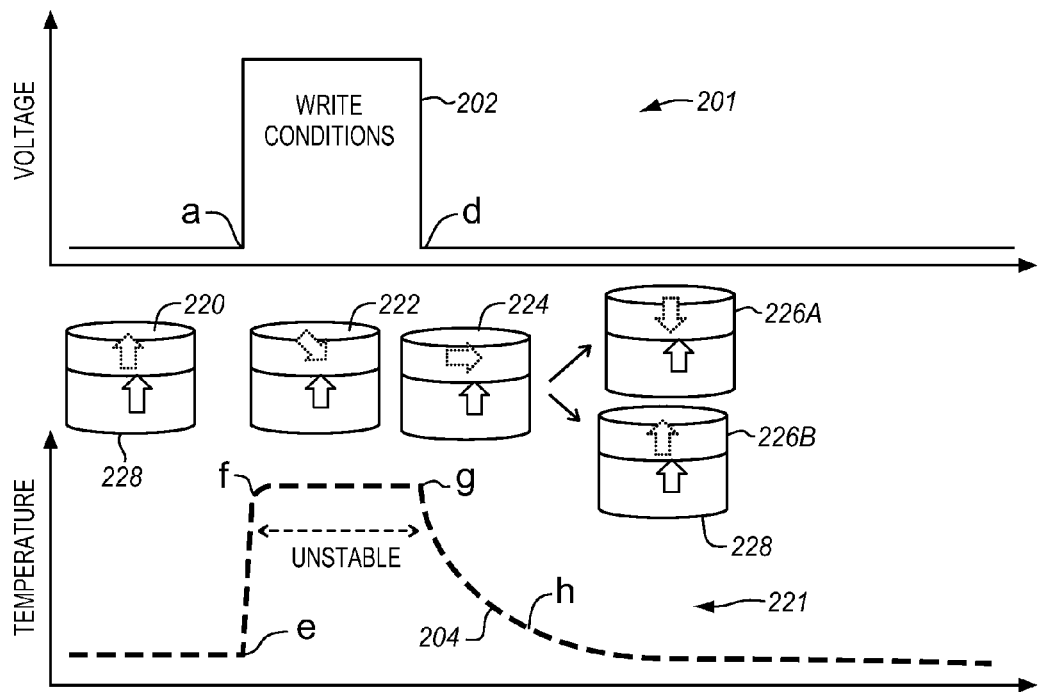
FIG. 2 is a graph of voltage and temperature over time for a write signal in an STTM according to an embodiment of the invention.

A phenomenon that may be used for writing to a cell using the write current to heat the cell is described in part in FIG. 2. In FIG. 2, a voltage graph 201 shows the voltage of the write signal 202 on the vertical axis over time on the horizontal axis. The write voltage line shows a single pulse being applied to an STTM cell. The pulse starts at time a and ends at time d. A second time-aligned temperature graph 221 shows the change in temperature within the memory cell and, in particular, in the free layer over the same time as measured by a temperature measurement signal 204. The condition of the memory cell over time is diagrammed by showing various changes of the free layer 220, 222, 224, 226 with respect to the pinned layer 228. Each diagram is approximately aligned with the horizontal time scale of the two graphs 201, 221.

During a write cycle 202 applied to the write terminals of a memory cell, the temperature of the memory cell rises very quickly as shown by the temperature curve 204 which is delayed only a small amount from the heating cycle 202. The write current starts at time a. The heating starts soon after at a time e. Before time a, the free layer 220 starts out in a particular perpendicular state. In the illustrated example, it is an up state and is aligned with the pinned layer 228.

The write current causes the memory cell to warm and it reaches its maximum temperature at time f. As it warms, the magnetic moment of the free layer 222 comes out from its perpendicular spin state. The write circuitry, such as a write controller, will be oriented to drive the free layer either to an anti-parallel state 226A, or a parallel state 226B. When the write current is switched off at time d, the free layer 224 of the memory cell has reached an unstable in-plane magnetization state but will be moving toward the perpendicular state upon cooling. While it is shown as having an in-plane state, the actual state is completely unknown. As the cell cools from time g through h, the free layer 224 has two states to which it can return. It may go to a spin up or parallel state 226A (the '1') or to a spin down or anti-parallel state 226B (the '0'). The transition is controlled by small variations in conditions that cannot easily be controlled by the driving circuitry. Consequently write errors are introduced.

Figure 3A:
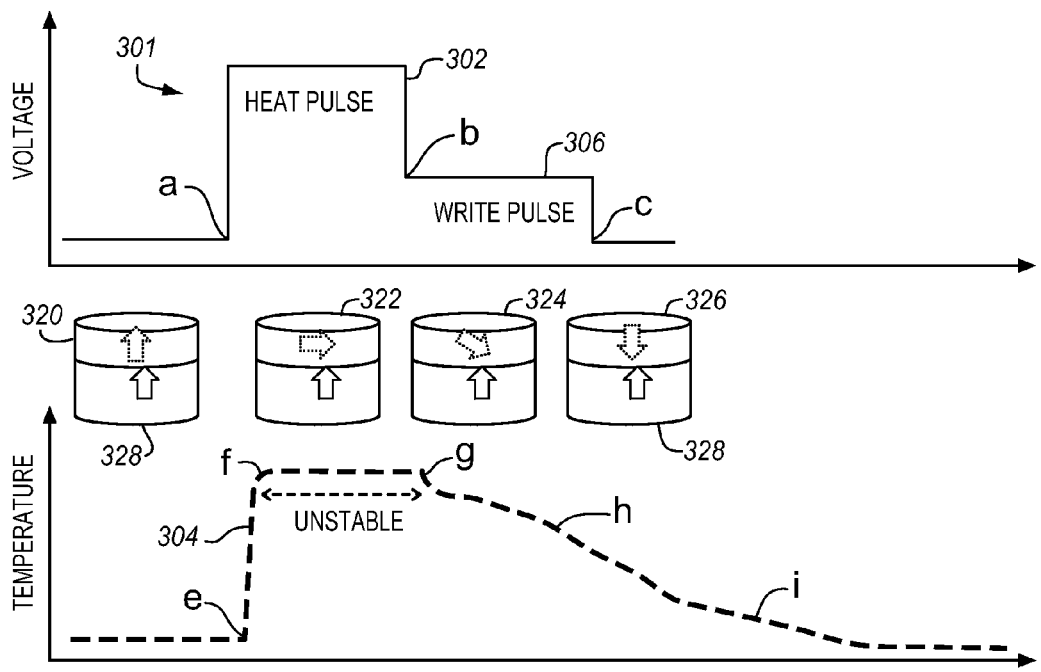
FIG. 3A is graph of voltage and temperature over time for a modified write signal in an STTM according to an embodiment of the invention.

In FIG. 3A, two time-aligned graphs are shown similar to FIG. 2, except that the signal 302, 306 that is applied to the write line is different. The first graph 301 shows the change in voltage of the write signal 302, 306 on the vertical axis over time on the horizontal axis. The write voltage line shows a first heat pulse 302 followed by a second write pulse 306 being applied to an STTM cell. The second time-aligned graph 304 shows the change in temperature on the vertical axis in the free layer of the memory cell over the same time on the horizontal axis. The condition of the memory cell over time is similarly diagrammed by showing various changes of the pinned layer 328 and the free layer 320, 322, 324, 326.

In the example of FIG. 3A, the write operation is divided into two parts: a heat pulse 302; and a write pulse 306. The duration and amplitude of this pulse may be similar to the normal 'write' conditions that might be used in a conventional STTM. The heat pulse is followed immediately afterwards by a write pulse 306. The second write pulse is at lower power or voltage than the heat pulse.

The temperature curve 304 shows that as in FIG. 2 when the voltage is applied at time a, the cell starts to heat soon thereafter at time e and quickly reaches the maximum temperature at time f. The heat pulse is switched off at time b and the lower power write pulse 306 is applied. Soon after time b, the memory cell begins to cool at time g and the temperature falls. After time c, the write pulse is turned off, the rate of cooling hits a transition point at time h and starts cooling faster along slope h. The write pulse does not heat the free layer as compared to the heat pulse and also slows the cooling of the memory cell.

As in the example of FIG. 2, as the memory cell is heated the pinned layer 328 remains in the same state, but the free layer 320 originally in a defined, stable perpendicular state, loses that state. The heated free layer 322 has an uncertain state sometime after times a. and f. As the cell cools starting at time g, the state of the free layer 324 is influenced by the write portion 306 of the pulse. As the cell continues to cool the state of the free layer is further controlled by the write pulse. At time h, the free layer 326 has reached the intended perpendicular state and will remain in this state as the temperature continues to decline along slope i. The cell is allowed to cool down during the second write pulse and then cools further after the write pulse is shut off.

The write pulse 306 of FIG. 3A is not used for heating. It does not supply enough energy to increase the temperature of the cell. It is used only to orient the free layer magnet 320 either up or down according to the direction of the applied voltage. This is similar to the operation of a write pulse in a cell with a heater element and the same technologies and pulse parameters may be used. In the example of FIG. 3A, the write pulse 306 is immediately after and adjoining the heat pulse 302.

Figure 3B:
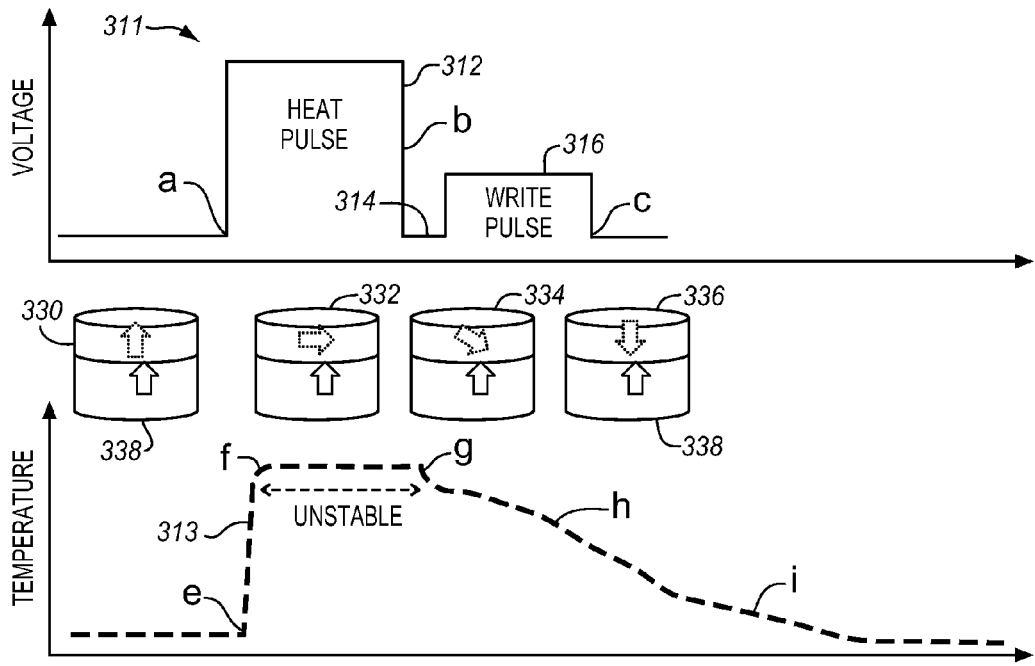
FIG. 3B is graph of voltage and temperature over time for a second modified write signal in an STTM according to an embodiment of the invention.

In FIG. 3B, a write pulse 316 follows a heat pulse 312 after a short time interval 314. The duration of the time interval may be determined by modeling the thermal behavior of the cell. As in FIG. 3A, the initial heating will free the state of the free layer. The interval will allow the free layer to begin to stabilize and the write pulse will then drive the free layer to the intended state. Two time-aligned graphs are shown similar to FIG. 3A, except that the signal 312, 316 that is applied to the write line has changed. The first graph shows the change in voltage of the write signal as the heat pulse 312, followed by a delay 314, followed by a write pulse 316 on the vertical axis over time on the horizontal axis. These are applied to the STTM cell. The second time-aligned graph 313 shows the change in temperature of the memory cell over the same time scale.

When the heat level voltage is applied at time a, the cell starts to heat soon thereafter at time e and has quickly reached the maximum temperature at time f. With the heat, the free layer of the memory cell moves parallel perpendicular state 330 to an in-plane state 332. Alternatively, the memory cell may already be in a free or unknown state. The heat pulse is switched off at time b. Soon after time b, the memory cell begins to cool at time g. The write pulse 316 is turned on after a short delay 314, but the write pulse does not have enough power to heat the cell, only enough power to drive the free layer from an in-plane state 334 to an intended anti-parallel state 336. After time c, when the write pulse is turned off, the rate of cooling increases at time h until the memory cell is back to its normal temperature.

The write pulse 316 of FIG. 3B is also not used for heating. It does not supply enough energy to increase the temperature of the cell. It is used only to orient the free layer magnet 320 either up or down according to the direction of the applied voltage.

Figure 3C:
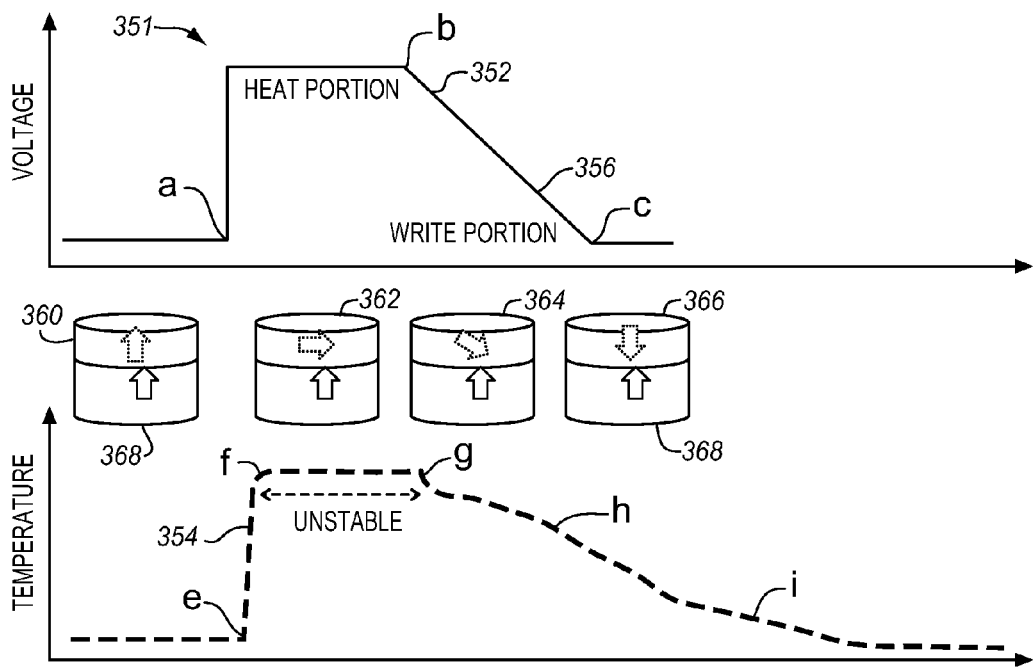
FIG. 3C is graph of voltage and temperature over time for a third modified write signal in a typical STTM according to an embodiment of the invention.

In FIG. 3C, a write pulse 356 immediately follows a heat pulse 352 and is immediately adjacent to it, although it could be spaced apart as well. Instead of being a pulse with a constant voltage, as shown in FIGS. 3A and 3B, the write pulse in FIG. 3C slopes downward from an initial high voltage to a final zero or near zero voltage. There are two time-aligned graphs the first graph 351 shows the write line voltage and the second one 354 shows the temperature of the free layer of the memory cell. The write voltage has a first heat pulse 352 followed by a second write pulse 356. The write pulse may start at the same voltage as the heat pulse, as shown, or at a lower voltage. It may decrease gradually, as shown, with a flat ramp, a curve, or in steps. The particular shape of the curve may be modified to suit different applications.

In the example of FIG. 3C, when the write line voltage is applied at time a, the cell heats, starting at time e, up to a high temperature at time f. The heat portion of the write line voltage ends at time b and the voltage decreases as the write line goes to the write portion of the write line voltage. The memory cell cools starting at time g as the voltage drops. At time c the write pulse has reached its lowest level and the memory cell continues to cool at times h and i. The sloped write pulse allows for some cooling compared to square pulses described above but maintains a polarization on the free layer as it cools. The sloped write pulse can be much longer than the square pulses in order to further ensure the certainty of the state of the free layer.

The states of the free layer with respect to the pinned layer are shown using diagrams roughly timed to align with the two graphs. Originally, the free layer 360 and the pinned layer 368 are parallel. However, they may alternatively start out as anti-parallel or the state of the free layer may be unknown or unstable. As the heat portion of the pulse is applied, the free layer 362 is released to an unstable, transition state. As the write voltage is applied and the temperature decrease after times b and g, the free layer 364 is driven toward an intended perpendicular state, either parallel or anti-parallel. Finally, the free layer 366 has reached the intended perpendicular state.

In each of the described examples, the shape of the pulse is in two stages or portions, an initial stage and a trailing edge. The first part switches the magnetization from perpendicular to in plane. The second part of the pulse is applied with a significantly lower current. The second part switches the magnetization to a perpendicular state with a direction depending on the polarity of the applied current. The function of the first stage is to switch the magnetization out of perpendicular to in-plane orientation. For this stage the polarity of the applied current does not matter. For the second stage the polarity of the current will determine the value that will be stored in the memory.

While the pulses are shown as square waves in the voltage domain, in an actual application, the pulses will have some rounding and other artifacts. In addition, the pulses may increase and decrease in voltage more slowly than indicated. More than two different voltage levels may be used. The temperature curve is shown as being the same in the graphs of FIGS. 3A, 3B, and 3C. Depending on the applied voltage or power and the applied duration, the temperature curves may all be the same. However, the pulses may be modified to produce a different temperature curve to suit any particular application. The graphs are shown without units for voltage or time. The best choice of voltage and duration will depend on the particular construction of the memory cell, how responsive it is, how well it retains heat, and the current levels that are applied. These factors will depend on the physical parameters and materials of the cell and related circuitry as well as its intended application.

The examples of FIGS. 3A, 3B, and 3C show a process to switch the free layer from up 320, 330, and 360 to down 326, 336 and 366 in a perpendicular STTM. The same principle using an opposite polarization can be used to switch the free layer from down to up.

The voltages, times, and temperatures for writing a change of state can be estimated for different types of insulating layers and approaches. An STTM for use as computer memory can be augmented with for example a 10 nm thick layer of $Ge_2SB_2Te_5$ (GST) on both sides of the memory cell as shown in FIG. 1 at 120. Applying a regular write voltage to standard metal interconnects such as Cu, can cause a free layer temperature increase of up to 450°. A much lower temperature of 150° C. to 250° C. may be used to release the state of the free layer 222, 322, so this much insulation is more than enough to allow the write voltage to be used as a heater.

In an alternative example, the STTM can be fitted with multiple thin layers that have a strong thermal boundary resistance (TBR), such as a chalcogenide superlattice (e.g., a multilayered structure consisting of alternating dissimilar thin chalcogenide layers or thin layers of dissimilar materials. A simulation that gives a thermal boundary resistance between two layers can still provide an increase of 90° C., which may be enough to switch magnetization from perpendicular to in plane orientation depending on the operating temperature of the device. A variety of different insulation materials may be used in differing amounts to meet a variety of different design goals.

The STTM is also exposed to Joule heating from the voltage applied during a read cycle. If the voltage and duration were sufficiently large, then the read cycle might also result in a change of the memory cell state. This can cause read disturb errors. By adding thermal insulation to the memory cell, a read voltage that would otherwise be benign may be able to cause errors. However, proper construction of the memory cell and the read circuitry can reduce the energy supplied to the cell during a read. The energy can be one half to one quarter that of a write.

Figure 4:
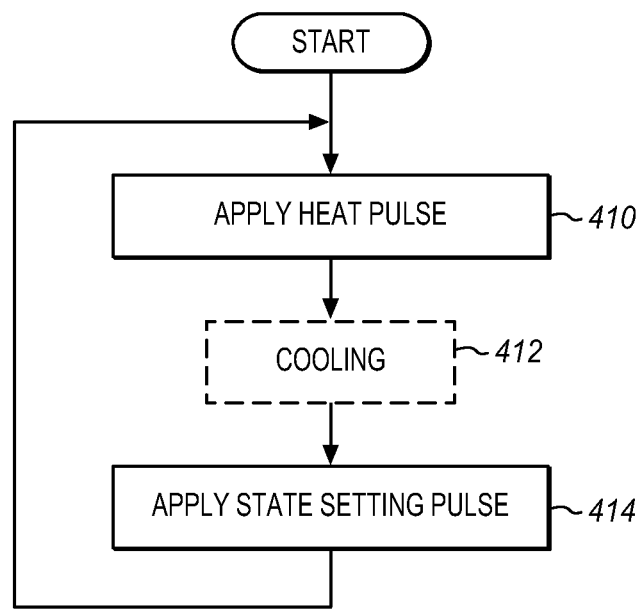
FIG. 4 is a process flow diagram of writing to an STTM according to an embodiment of the invention.

The write operations described above are diagrammed in the process flow diagram of FIG. 4. The process starts and a first pulse is applied sufficient to heat the memory cell at 410. The heating that is applied is selected to re-orient the state of the free layer of the memory cell from perpendicular to in plane magnetization and is applied in the same way as a write signal. In some implementations, this temperature is about 200° C. The polarity of the heat pulse is not important and may be the same or opposite from the write pulse. As a result, the heat circuitry may be made simpler by having no connection to the value of the data that is to be written.

At 412, the memory cell may be allowed to cool some. This step is optional and may not apply to all embodiments. The cooling may be done by shutting off the heat pulse and waiting some amount of time before applying the write pulse of block 414. Any of the write pulse configurations described above may be used. The write pulse has a lower energy level and has a definite polarity to set the state of the free layer. At the end of the write pulse, the write line returns to zero for the memory cell to completely cool and for the state of the cell to be stabilized. The operation then returns for the next operation. Read operations may happen at any time before or after a write operation.

Figure 5:
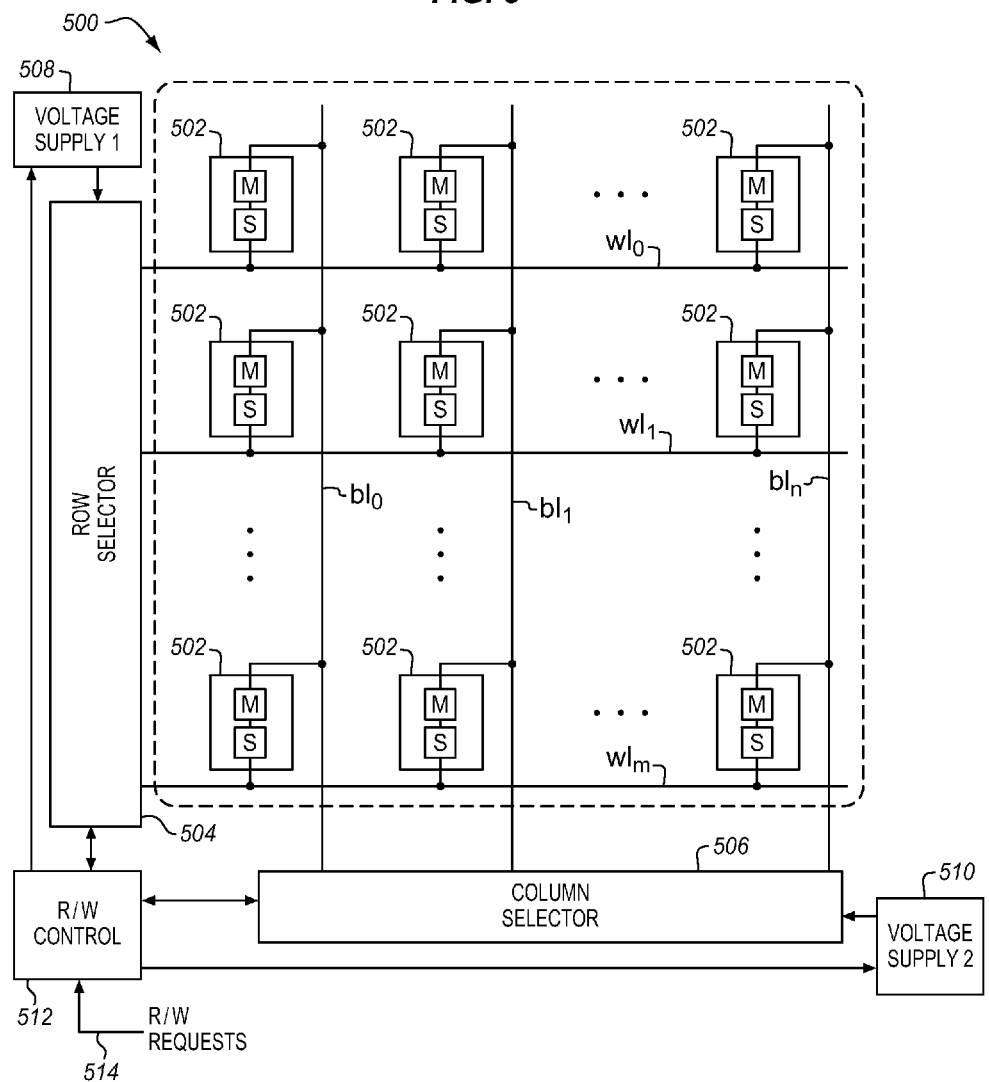
FIG. 5 is a block diagram of a memory array including STTMs according to an embodiment of the invention.

FIG. 5 is a block diagram of an array of STTM memory cells suitable for use with the present invention. The memory cells 502 of the array are arranged in rows and columns in which each cell is accessed by a row selector 504 and a column selector 506. The row and column selector cooperate to access any desired cell 502 of the array. The row selector is coupled to a first voltage supply 508 to power row accesses. The first voltage supply is also coupled to a read/write controller 512 which includes a write circuit that receives read and write requests on a request line 514 and then generates read and write signals through the row 504 and column 506 selectors as shown above in FIGS. 3A, 3B, and 3C. The column selector is similarly coupled to a second voltage supply 510 which also powers the read/write controller 514. As shown in FIG. 5, each memory cell is coupled through the row and column selectors to bit lines ($bl_0$ to $bl_n$) and word lines ($wl_1$ to $wl_m$) to allow each cell of the memory array to be accessed individually. The row and column selectors are coupled between the read/write controller and the plurality of memory cells to control access to each memory cell by the read/write controller. The row selector, column selector and read/write controller form at least part of a memory controller to access and control operation of the memory array.

Figure 6:
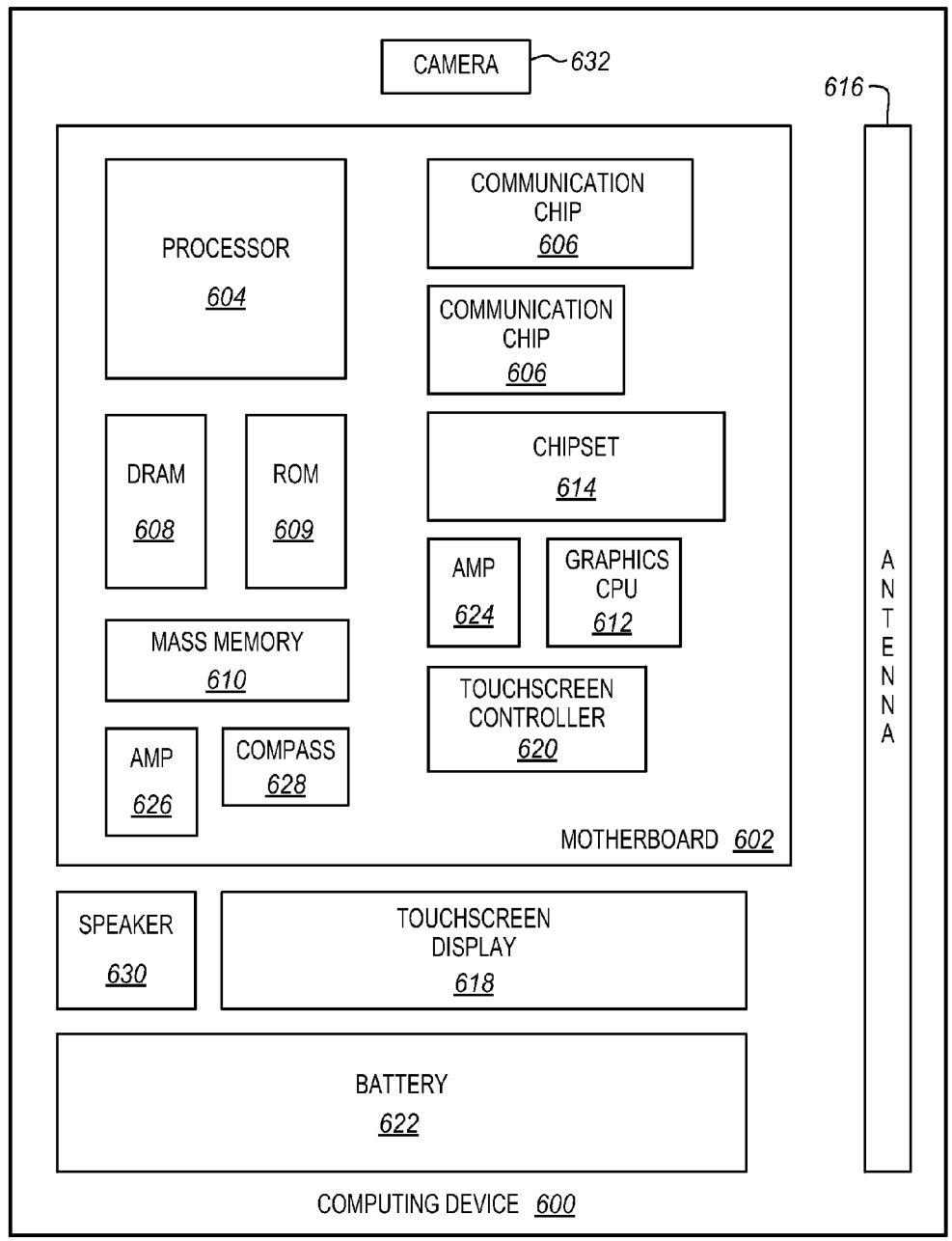
FIG. 6 is a block diagram of a computing device containing STTMs according to an embodiment of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM) 608, non-volatile memory (e.g., ROM) 609 such as STTM, flash memory (not shown), a graphics processor 612, a digital signal processor (not shown), a crypto processor (not shown), a chipset 614, an antenna 616, a display 618 such as a touchscreen display, a touchscreen controller 620, a battery 622, an audio codec (not shown), a video codec (not shown), a power amplifier 624, a global positioning system (GPS) device 626, a compass 628, an accelerometer (not shown), a gyroscope (not shown), a speaker 630, a camera 632, and a mass storage device (such as hard disk drive or STTM) 610, compact disk (CD) (not shown), digital versatile disk (DVD) (not shown), and so forth). These components may be connected to the system board 602, mounted to the system board, or combined with any of the other components.

The communication chip 606 enables wireless and/or wired communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor, DRAM, ROM, and mass memory, include one or more devices, such as STTM memory circuits, that are formed in accordance with implementations of the invention. The STTM memory circuits may be configured as an array as shown, for example, in FIG. 5. The term "processor" may refer to any device or portion of a device that processes electronic data from registers and/or memory to transform that electronic data into other electronic data that may be stored in registers and/or memory. Any one or more of the other devices of the computing device 600 may also include memory or registers formed using STTM in accordance with the implementations described above.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus comprising logic circuits coupled to memory cells of different types including some STTM memory cells. Some embodiments pertain to a method of driving a magnetic memory cell with a first pulse on a write line of the memory cell to heat the cell and then driving the cell with a second pulse on the write line to set the state of the cell.

In further embodiments, the first pulse and the second pulse are applied to a same write line of the cell. The first pulse carries more energy than the second pulse. The first pulse has a higher voltage than the second pulse. The first pulse adjoins the second pulse. The first pulse has a polarity that is independent of the state to which the cell will be set. The first pulse is configured to heat the cell to a state that frees the state of a free layer of the magnetic memory cell.

In further embodiments, the second pulse allows the memory cell to cool while driving the cell to an intended state. The first pulse is separated from the second pulse by a time interval. The time interval allows the memory cell to cool before the write pulse. The first pulse and the second pulse are merged so that the merged pulse has a trailing edge that is significantly longer than the leading edge. The first pulse and the second pulse are contiguous.

Some embodiments pertain an apparatus with a memory cell having a magnetic pinned layer and a magnetic free layer, electrodes coupled to the magnetic free layer to set a magnetic state of the free layer, and thermal insulation side walls around the memory cell.

In further embodiments, the thermal insulation sidewalls include an internal air gap. Thermal insulation covers the electrodes. The thermal insulation between the free layer and the electrode comprises chalcogenide compounds. The chalcogenide compounds comprise at least one of chalcogenide-based superlattice and chalcogenide-based multilayers of dissimilar materials. The thermal insulation the electrodes and the free and pinned layers comprise chalcogenide compounds. A write controller is coupled to the electrodes to write to the memory cell by driving a write current to set a state of the magnetic free layer and the write circuit further applies a heat pulse to the memory cell before writing to the memory cell.

What is claimed is:

1. A method comprising:
   driving a magnetic memory cell with a first pulse on a write line of the memory cell to heat the cell;
   driving the cell with a second pulse on the write line to set the state of the cell wherein the second pulse is wherein the second pulse is sloped downward from an initial high voltage to zero voltage.

2. The method of claim 1, wherein the first pulse and the second pulse are applied to a same write line, of the cell.

3. The method of claim 1, wherein the first pulse carries more energy than the second pulse.

4. The method of claim 1, wherein the first pulse has a higher voltage than the second pulse.

5. The method of claim 1, wherein the first pulse adjoins the second pulse.

6. The method of claim 1, wherein the first pulse has a polarity that is independent of the state to which the cell will be set.

7. The method of claim 1, wherein the first pulse is configured to heat the cell to a state that frees the state of a free layer of the magnetic memory cell.

8. The method of claim 1, wherein the second pulse allows the memory cell to cool while driving the cell to an intended state.

9. The method of claim 1, wherein a time interval allows the memory cell to cool before the write pulse.

10. The method of claim 1, wherein the first pulse and the second pulse are merged so that the merged pulse has a trailing edge that is significantly longer than the leading edge.

11. An apparatus comprising:
    a memory cell having a magnetic pinned layer and a magnetic free layer;
    electrodes coupled to the magnetic free layer to set a magnetic state of the free layer; and
    thermal insulation side walls around the memory cell, the thermal insulation comprising chalcogenide compounds.

12. The apparatus of claim 11, further comprising thermal insulation between the free layer and the electrode including chalcogenide compounds.

13. The apparatus of claim 11, wherein the chalcogenide compounds comprise at least one of chalcogenide-based superlattice and chalcogenide-based multilayers of dissimilar materials.

14. The apparatus of claim 11, further comprising thermal insulation to cover the electrodes wherein the thermal insulation of the electrodes and the free and pinned layers comprise chalcogenide compounds.

15. The apparatus of claim 11, further comprising a write controller coupled to the electrodes to write to the memory cell by driving a write current to set a state of the magnetic free layer and wherein the write circuit further applies a heat pulse to the memory cell before writing to the memory cell.

16. An apparatus comprising:
   a processor; and
   a memory array having:
      a plurality of memory cells coupled to the processor, each having a magnetic pinned layer and a magnetic free layer and electrodes coupled to the magnetic free layer to set a magnetic state of the free layer;
      a read/write controller to drive write lines coupled to an electrode of a each of the plurality of memory cells with a first pulse to heat the cell and with a second pulse to set the state of the cell wherein the second pulse is sloped downward from an initial high voltage to zero voltage; and
      row and column selectors between the read write controller and the plurality of memory cells to control access to each memory cell by the read/write controller.

17. The apparatus of claim 16, each memory cell further comprising thermal insulation having multiple layers of dissimilar materials.

18. The method of claim 1, wherein the second pulse is sloped and much longer than the first pulse.

19. The method of claim 1, wherein the second pulse has a lower energy than the first pulse.

20. The method of claim 1, wherein the second pulse is separated from the first pulse by a time interval.

* * * * *